(12) United States Patent
Zou

(10) Patent No.: US 11,302,891 B2
(45) Date of Patent: Apr. 12, 2022

(54) FLEXIBLE OLED DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Xin Zou, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 459 days.

(21) Appl. No.: 16/467,772

(22) PCT Filed: Feb. 20, 2019

(86) PCT No.: PCT/CN2019/075620
§ 371 (c)(1),
(2) Date: Jun. 7, 2019

(87) PCT Pub. No.: WO2020/124773
PCT Pub. Date: Jun. 25, 2020

(65) Prior Publication Data
US 2021/0359257 A1    Nov. 18, 2021

(30) Foreign Application Priority Data

Dec. 17, 2018 (CN) .......................... 201811544625.9

(51) Int. Cl.
*H01L 21/00* (2006.01)
*H01L 51/52* (2006.01)
(Continued)

(52) U.S. Cl.
CPC ...... *H01L 51/5253* (2013.01); *H01L 27/3244* (2013.01); *H01L 51/0005* (2013.01);
(Continued)

(58) Field of Classification Search
CPC ............. H01L 27/3244; H01L 51/0097; H01L 2251/5338
See application file for complete search history.

(56) References Cited

U.S. PATENT DOCUMENTS 10,319,938 B2 *   6/2019   Choi .................... H01L 51/5237
11,018,318 B2 *   5/2021   Huang ................ H01L 51/5253
(Continued)

FOREIGN PATENT DOCUMENTS

CN    101099188 A  *  1/2008
CN    103915474 A  *  7/2014  ......... H01L 27/3276
(Continued)

*Primary Examiner* — Laura M Menz
(74) *Attorney, Agent, or Firm* — Osha Bergman Watanabe & Burton LLP

(57) ABSTRACT

A flexible organic light emitting diode (OLED) display panel includes a flexible substrate, a display layer disposed on the flexible substrate, a first inorganic layer disposed on the display layer, a barrier wall disposed on the first inorganic layer and configured to prevent moisture and oxygen intrusion, an organic layer disposed on the barrier wall and the first inorganic layer, and a second inorganic layer disposed on the organic layer. The flexible OLED display panel is bendable at a preset bending area, and the barrier wall is disposed in the preset bending area and located outside an active area of the flexible OLED display panel.

5 Claims, 7 Drawing Sheets

(51) Int. Cl.
    *H01L 27/32*           (2006.01)
    *H01L 51/00*           (2006.01)
    *H01L 51/56*           (2006.01)

(52) U.S. Cl.
    CPC .......... *H01L 51/0097* (2013.01); *H01L 51/56* (2013.01); *H01L 2227/323* (2013.01); *H01L 2251/301* (2013.01); *H01L 2251/5338* (2013.01)

(56) References Cited

U.S. PATENT DOCUMENTS

| | | | |
|---|---|---|---|
| 11,223,029 B2 * | 1/2022 | Wu | H01L 27/3244 |
| 2014/0183470 A1 * | 7/2014 | Kim | H01L 51/5253 257/40 |
| 2014/0323006 A1 * | 10/2014 | Song | H01L 51/5256 445/24 |
| 2016/0260928 A1 * | 9/2016 | Choi | H01L 51/5253 |
| 2018/0026226 A1 * | 1/2018 | Choi | H01L 51/5056 257/552 |
| 2018/0123060 A1 * | 5/2018 | Jang | H01L 27/1218 |
| 2018/0159074 A1 * | 6/2018 | Kim | H01L 51/5253 |
| 2018/0198092 A1 * | 7/2018 | Choi | H01L 51/5253 |
| 2018/0226607 A1 * | 8/2018 | Li | H01L 51/5253 |
| 2019/0245015 A1 * | 8/2019 | Lee | H01L 51/5246 |
| 2019/0288232 A1 * | 9/2019 | Choi | H01L 51/5237 |
| 2019/0296260 A1 * | 9/2019 | Li | H01L 51/0097 |
| 2020/0119110 A1 * | 4/2020 | Chen | H01L 51/0097 |
| 2020/0174526 A1 * | 6/2020 | Jeong | G09F 9/301 |
| 2020/0403179 A1 * | 12/2020 | Hu | H01L 51/5253 |
| 2021/0083223 A1 * | 3/2021 | Guo | H01L 51/5253 |
| 2021/0359258 A1 * | 11/2021 | Guo | H01L 51/5253 |
| 2021/0408458 A1 * | 12/2021 | Lu | H01L 51/5253 |
| 2021/0408469 A1 * | 12/2021 | Ye | H01L 51/5253 |

FOREIGN PATENT DOCUMENTS

| | | | | |
|---|---|---|---|---|
| CN | 104916787 A | * | 9/2015 | |
| CN | 105895827 A | * | 8/2016 | ........... H01L 51/525 |
| CN | 207896125 U | * | 9/2018 | |
| CN | 108886855 A | * | 11/2018 | ........ C23C 14/5846 |
| CN | 109546002 A | * | 3/2019 | |
| CN | 109546006 A | * | 3/2019 | |
| CN | 109659444 A | * | 4/2019 | |
| CN | 110148620 A | * | 8/2019 | |
| CN | 110235521 A | * | 9/2019 | ........ H01L 51/0097 |
| CN | 110419266 A | * | 11/2019 | ........ H01L 51/0097 |
| CN | 111192976 A | * | 5/2020 | |
| JP | 2010244696 A | * | 10/2010 | |
| JP | 2015176717 A | * | 10/2015 | |
| JP | 2018174128 A | * | 11/2018 | |
| JP | 2020060651 A | * | 4/2020 | ............. H05B 33/10 |
| WO | WO-2006075483 A1 | * | 7/2006 | ........... H01L 27/124 |
| WO | WO-2018142490 A1 | * | 8/2018 | ............. H05B 33/22 |
| WO | WO-2018158953 A1 | * | 9/2018 | ............... G09F 9/30 |
| WO | WO-2018167923 A1 | * | 9/2018 | ............. H05B 33/04 |
| WO | WO-2019012659 A1 | * | 1/2019 | ............... G09F 9/30 |
| WO | WO-2020020023 A1 | * | 1/2020 | ........ H01L 51/0097 |
| WO | WO-2020026417 A1 | * | 2/2020 | ............. H01L 51/56 |
| WO | WO-2020124773 A1 | * | 6/2020 | |
| WO | WO-2021159584 A1 | * | 8/2021 | |

\* cited by examiner

FLEXIBLE OLED DISPLAY PANEL AND MANUFACTURING METHOD THEREOF

BACKGROUND OF INVENTION

1. Field of Invention

The present invention relates to a display field, and particularly, to a flexible organic light emitting diode (OLED) display panel and manufacturing method thereof.

2. Related Art

Flat panel displays have many advantages, such as being compact, power saving, radiation-free, etc., and thus have been widely used. Existing flat displays mainly include liquid crystal display (LCD) devices and organic light emitting display (OLED) devices.

OLED devices have been regarded as new application technology for a next generation of flat displays because of outstanding characteristics of being self-luminous, backlight-free, high contrast, thin thickness, wide viewing angles, quick response times, adaptable to flexible panels, wide temperature ranges, simplified structure, and manufacturing processes. An OLED device generally includes: a substrate, an anode disposed on the substrate, an organic light emitting layer disposed on the anode, an electron transport layer disposed on the organic light emitting layer, and a cathode disposed on the electron transport layer. In operation, holes from the anode and electrons from the cathode are emitted to the organic light-emitting layer, and these electrons and holes are combined to generate an excited electron-hole pair, and the excited electron-hole pair is converted from an excited state to a ground state to achieve light emission.

An important research direction of OLED displays is aimed at flexible OLED panels, which are configured with flexible substrates instead of traditional glass substrates to enable flexibility of panels, thereby bringing consumers an innovative concept that enhances user experience and product competitiveness. In recent years, flexible OLED display technology has developed rapidly, and flexible products in various fields continue to be mass-produced. Compared with traditional glass rigid displays, flexible displays have a series of advantages, such as impact resistance, shock resistance, light weight, small-sized, and even wearability.

However, current OLED display panel technology is not mature enough. There are still lots of problems about bending radius, reliability, and mass production limiting development of flexible OLED display panels. Particularly, existing flexible displays are widely configured with thin-film flexible display substrates to ensure bending performance. However, for such flexible display panels, there are still certain difficulties to be overcome to guarantee service life of display devices. The key point is that when flexible OLED display panels are bending, cracks tend to occur at where the flexible OLED display panels are bending, resulting in water and oxygen intrusion, thereby lowering product performance and reducing service life of products.

SUMMARY OF INVENTION

An object of the present invention is to provide a flexible organic light emitting diode (OLED) display panel, capable of improving performance of blocking water and oxygen in the bending area of the flexible OLED display panel, thereby extending a lifespan of the flexible OLED display panel and avoiding abnormal display caused by cracks in the bending area.

Another object of the present invention is to provide a method of manufacturing a flexible OLED display panel, capable of improving performance of blocking water and oxygen in the bending area of the flexible OLED display panel, thereby extending a lifespan of the flexible OLED display panel and avoiding abnormal display caused by cracks in the bending area.

To achieve the above-mentioned objects, the present invention provides a flexible OLED display panel, comprising a flexible substrate, a display layer disposed on the flexible substrate, a first inorganic layer disposed on the display layer, a barrier wall disposed on the first inorganic layer and configured to prevent moisture and oxygen intrusion, an organic layer disposed on the barrier wall and the first inorganic layer, and a second inorganic layer disposed on the organic layer.

The flexible OLED display panel is bendable at a preset bending area, and the barrier wall is disposed in the preset bending area and located outside an active area of the flexible OLED display panel.

The flexible OLED display panel is capable of bending at the preset bending area, number of the barrier wall is two, and the two barrier walls are disposed at two ends of the bending area, respectively.

The flexible OLED display panel is capable of bending at two preset bending areas spaced apart from each other, number of the barrier wall is four, and the barrier walls are disposed at two ends of each of the bending areas, respectively.

The barrier wall is made of a composite of high molecular polymer and water-absorbing nanoparticles.

The high molecular polymer is selected from a group consisting of acryl, polyethylene and polycarbonate, and the moisture-absorbing nanoparticles each are selected from a group consisting of calcium oxide and calcium chloride.

The present invention further provides a method of manufacturing a flexible organic light emitting diode (OLED) display panel, comprising following steps:

step S1, providing a flexible substrate and forming a display layer on the flexible substrate;

step S2, forming a first inorganic layer on the display layer;

step S3, forming a barrier wall on the first inorganic layer; and step S4, forming an organic layer on the barrier wall and the first inorganic layer, and forming a second inorganic layer on the organic layer to finalize the flexible OLED display panel.

The flexible OLED display panel is bendable at a preset bending area, and the barrier wall is disposed in the preset bending area and located outside an active area of the flexible OLED display panel.

The flexible OLED display panel is capable of bending at the preset bending area, number of the barrier wall is two, and the two barrier walls are disposed at two ends of the bending area, respectively.

The flexible OLED display panel is capable of bending at the preset bending areas spaced apart from each other, number of the barrier wall is four, and the barrier walls are disposed at two ends of each of the bending areas, respectively.

The barrier wall is made of a composite of high molecular polymer and water-absorbing nanoparticles, the high molecular polymer is selected from a group consisting of acryl, polyethylene and polycarbonate, and the water-absorbing nanoparticles each are selected from a group consisting of calcium oxide and calcium chloride.

The first inorganic layer and the second inorganic layer are formed by a chemical vapor deposition process, the organic layer is formed by a spin coating process or an inkjet printing process, and the barrier wall is formed by a spraying process or an inkjet printing process.

The present invention has advantageous effect as follows: the present invention provides a flexible organic light emitting diode (OLED) display panel including a flexible substrate, a display layer disposed on the flexible substrate, a first inorganic layer disposed on the display layer, a barrier wall disposed on the first inorganic layer and configured to prevent moisture and oxygen intrusion, an organic layer disposed on the barrier wall and the first inorganic layer, and a second inorganic layer disposed on the organic layer. The flexible OLED display panel is bendable at a preset bending area, and the barrier wall is disposed in the preset bending area and located outside an active area of the flexible OLED display panel. By adding the barrier wall in the bending area, the flexible OLED display panel can be improved on the performance of blocking water and oxygen in the bending area, thereby extending a lifespan of the flexible OLED display panel and avoiding abnormal display caused by cracks in the bending area. The present invention further provides a method of manufacturing a flexible OLED display panel, capable of improving performance of blocking water and oxygen in the bending area of the flexible OLED display panel, thereby extending a lifespan of the flexible OLED display panel and avoiding abnormal display caused by cracks in the bending area.

BRIEF DESCRIPTION OF DRAWINGS

In order to further understand features and technical contents of the present invention, please refer to the following detailed description of the present invention and the accompanying drawings. However, the drawings are for the purpose of illustration and description, and are not intended to limit the present invention.

DESCRIPTION OF PREFERRED EMBODIMENTS

Figure 1:
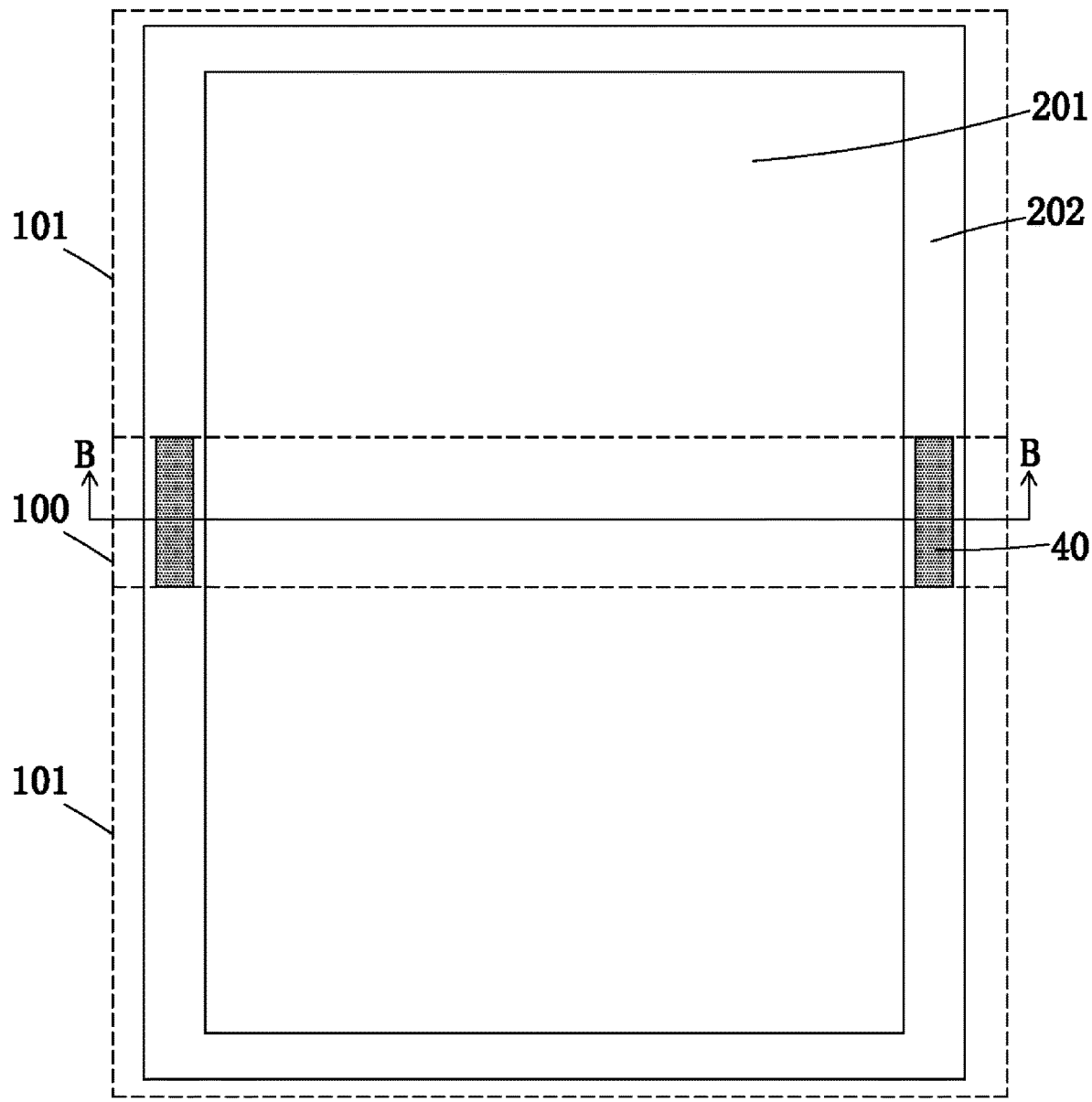
FIG. 1 is a top plan view of a flexible organic light emitting diode (OLED) display panel in accordance with a first embodiment of the present invention.
Figure 2:
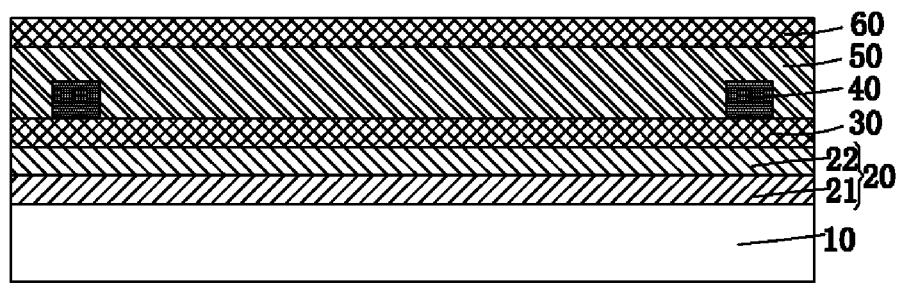
FIG. 2 is a cross-sectional view taken along line A-A of FIG. 1.

In order to further clarify technical solutions and effects of the present invention, the following detailed description are made in conjunction with the preferred embodiments and the accompanying drawings of the invention.

Please refer to FIGS. 1 to 6. The present invention provides a flexible organic light emitting diode (OLED) display panel including a flexible substrate 10, a display layer 20 disposed on the flexible substrate 10, a first inorganic layer 30 disposed on the display layer 20, a barrier wall 40 disposed on the first inorganic layer 30 and configured to prevent moisture and oxygen intrusion, an organic layer 50 disposed on the barrier wall 40 and the first inorganic layer 30, and a second inorganic layer 60 disposed on the organic layer 50.

The flexible OLED display panel is bendable at a preset bending area 100, and the barrier wall 40 is disposed in the preset bending area 100 and located outside an active area of the flexible OLED display panel.

Specifically, positions and a number of the preset bending area 100 can be varied subject to practical requirements. Positions and a number of the barrier wall 40 may be varied subject to change of positions and a number of the bending area 100.

Figure 4:
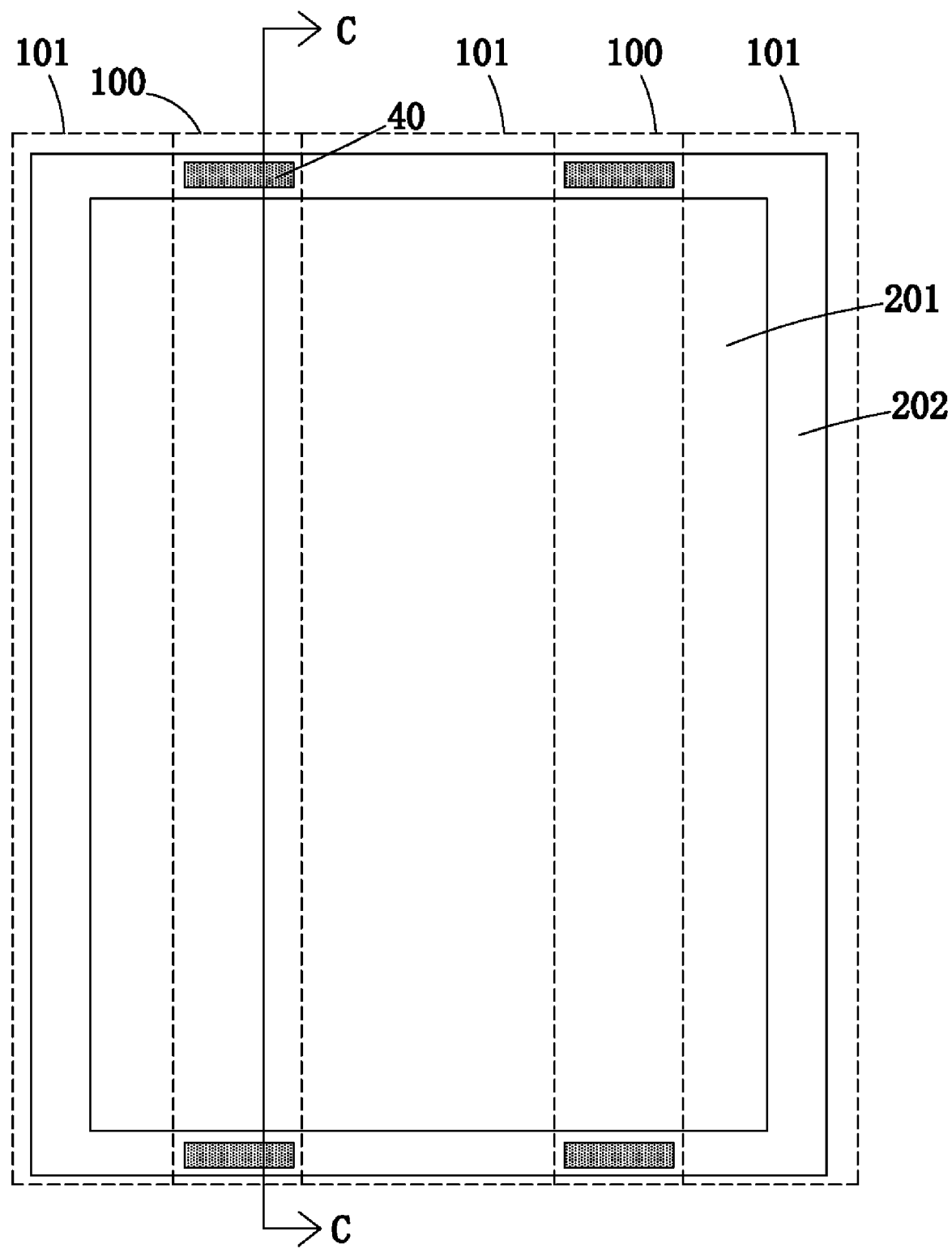
FIG. 4 is a top plan view of a flexible OLED display panel in accordance with a second embodiment of the present invention.
Figure 5:
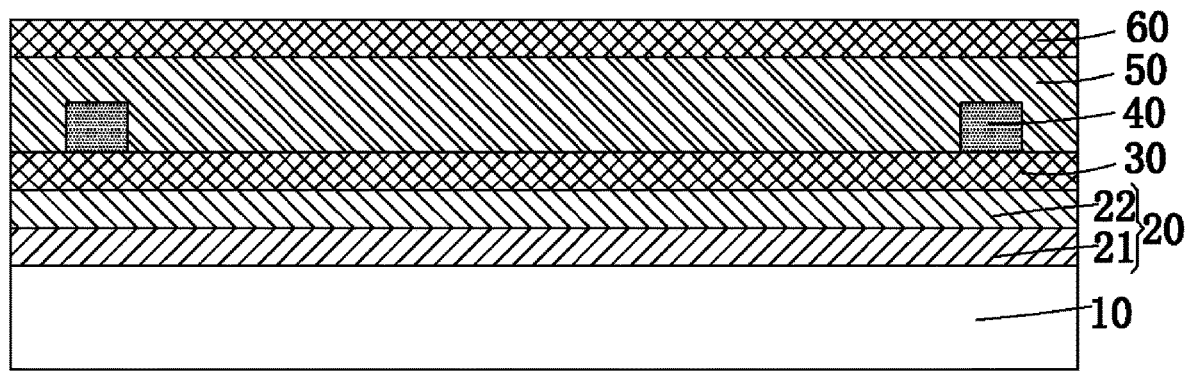
FIG. 5 is a cross-sectional view taken along line B-B of FIG. 4.

Specifically, as shown in FIG. 1 or FIG. 4, the flexible OLED display panel, according to whether or not it displays, is defined into an active area (AA) 201 and a non-active area 202 surrounding the active area 201. The flexible OLED display panel, according to whether it is bent, is further defined into a bending area 100 and a non-bending area 101 disposed outside the bending area 100, wherein a place that the bending area 100 and the non-active area 202 overlap is where the barrier wall 40 is located at, and in order to ensure performance on blocking water and oxygen, a length of the bending area 100 is equal to a length of the barrier wall 40 in a bending direction along the bending area 100, thereby the barrier wall 40 can completely prevent intrusion of water and oxygen into the bending area 100 after bending.

Specifically, as shown in FIG. 1, the flexible OLED display panel is bendable at the preset bending area 100. A number of the barrier wall 40 is two, and the two barrier walls 40 are disposed at two ends of the bending area 100, respectively.

Furthermore, in a first embodiment of the present invention, the flexible OLED display panel, according to whether it is bent, is defined into a bending area 100 and two non-bending areas 101 disposed on upper and lower sides of the bending area 100. A middle portion of the bending area 100 falls into the active area 201, and left and right sides of the bending area 100 fall into the non-active area 202. The two barrier walls 40 are disposed in two areas where the left and right sides of the bending area 100 fall into the non-active area 202.

Figure 3:
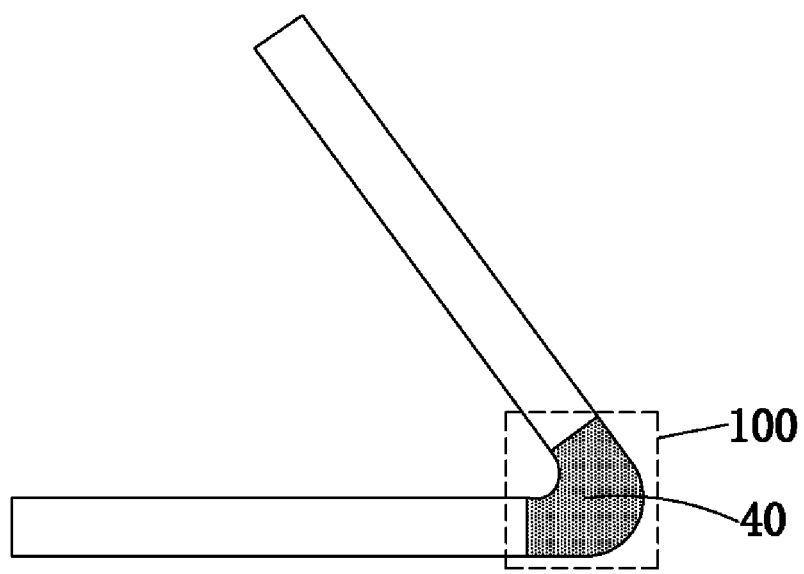
FIG. 3 is a schematic view showing the flexible OLED display panel in a bending state in accordance with the first embodiment of the present invention.

As shown in FIG. 3, in the first embodiment of the present invention, the flexible OLED display panel is bendable at upper and lower sides of the bending area 100, so that the two non-bending areas 101 cooperatively form an angle. The barrier walls 40 at opposite sides of the bending area 100 completely block an intrusion path of water and oxygen, thereby to increase a lifespan of the flexible OLED display panel, and to avoid abnormal display caused by cracks in the bending area.

Specifically, as shown in FIG. 4, the flexible OLED display panel is bendable at two preset bending areas 100. A number of the barrier wall 40 is four, and each of two ends of each bending area 100 is configured with the barrier wall 40.

Furthermore, in a second embodiment of the present invention, the flexible OLED display panel, according to whether it is bent, is defined into two bending areas 100 spaced apart from each other, two non-bending areas 101 disposed at left and right sides of the two bending areas 100, and a non-bending area 101 disposed between the two bending areas 100. Middle portions of the bending areas 100 fall into the active area 201, and upper and lower sides of the bending areas 100 fall into the non-active area 202. The four barrier walls 40 are disposed in four areas where the upper and lower sides of the two bending areas 100 fall into the non-active area 202.

Figure 6:
FIG. 6 is a schematic view showing the flexible OLED display panel in a bending state in accordance with the second embodiment of the present invention.

As shown in FIG. 6, in the second embodiment, the flexible OLED display panel is bendable at left and right sides of the bending area 100, so that the flexible OLED display panel bends to form an inverted U shape. The barrier walls 40 at opposite sides of the bending area 100 completely block an intrusion path of water and oxygen, thereby to increase a lifespan of the flexible OLED display panel, and to avoid abnormal display caused by cracks in the bending area.

Specifically, material of the barrier wall 40 is particles capable of absorbing water and oxygen, such as a composite of high molecular polymer and water-absorbing nanoparticles. Preferably, the high molecular polymer is selected from a group consisting of acryl, polyethylene, and polycarbonate. The moisture-absorbing nanoparticles each are selected from a group consisting of calcium oxide and calcium chloride.

Specifically, a thickness of the barrier wall 40 in a direction perpendicular to the first inorganic layer 30 is 1-3 micrometers.

Specifically, the first inorganic layer 30 and the second inorganic layer 60 are made of a group consisting of silicon nitride, silicon oxide, and aluminum oxide.

Specifically, the organic layer is made of hexamethyldisiloxane, polyacrylate, or polystyrene. A thickness of the organic layer 50 is slightly greater than a thickness of the barrier wall 40 to ensure that the organic layer 50 can cover the barrier wall 40.

Figure 7:
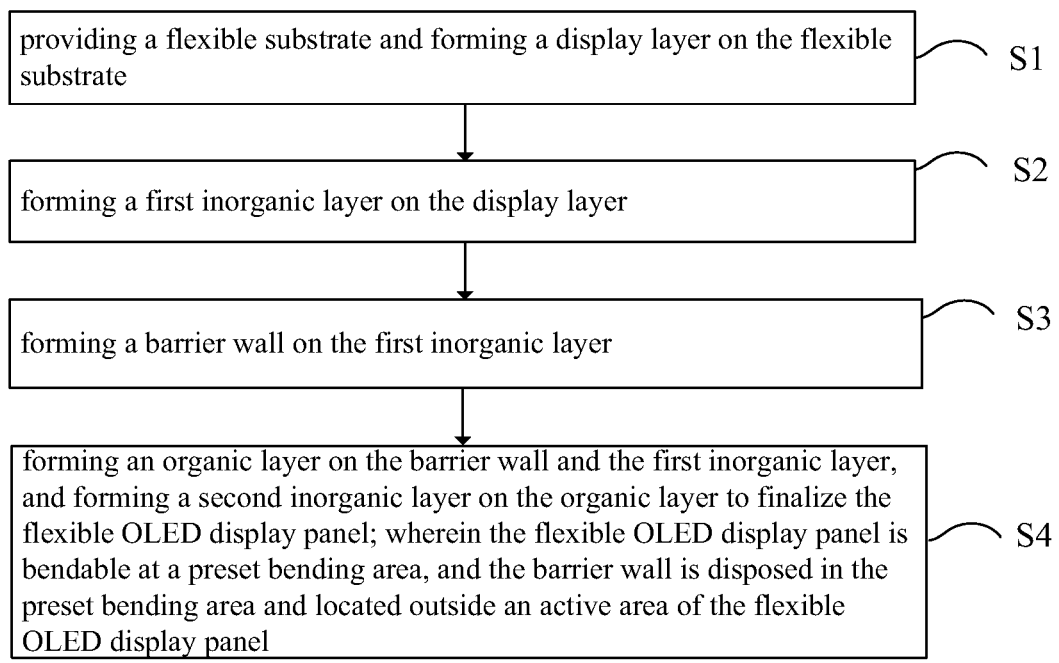
FIG. 7 is a flowchart of a method of manufacturing a flexible OLED display panel in accordance with the second embodiment of the present invention.

Please refer to FIG. 7. The present invention further provides a method of manufacturing a flexible organic light emitting diode. The manufacturing method includes following steps:

step S1, providing a flexible substrate 10 and forming a display layer 20 on the flexible substrate 10;

step S2, forming a first inorganic layer 20 on the display layer 20;

step S3, forming a barrier wall 40 on the first inorganic layer 30; and step S4, forming an organic layer 50 on the barrier wall 40 and the first inorganic layer 30, and forming a second inorganic layer 60 on the organic layer 50 to finalize the flexible OLED display panel;

wherein the flexible OLED display panel is bendable at a preset bending area 100, and the barrier wall 40 is disposed in the preset bending area 100 and located outside an active area of the flexible OLED display panel.

Specifically, positions and a number of the preset bending area 100 can be varied subject to practical requirements. Positions and a number of the barrier wall 40 may be varied subject to change of positions and number of the bending area 100.

Specifically, as shown in FIG. 1 or FIG. 4, the flexible OLED display panel, according to whether or not it displays, is defined into an active area (AA) 201 and a non-active area 202 surrounding the active area 201. The flexible OLED display panel, according to whether it is bent, is further defined into a bending area 100 and a non-bending area 101 disposed outside the bending area 100, wherein a place that the bending area 100 and the non-active area 202 overlap is where the barrier wall 40 is located at, and in order to ensure performance on blocking water and oxygen, a length of the bending area 100 is equal to a length of the barrier wall 40 in a bending direction along the bending area 100, thereby the barrier wall 40 can completely prevent intrusion of water and oxygen into the bending area 100 after bending.

Specifically, as shown in FIG. 1, the flexible OLED display panel is bendable at the preset bending area 100. A number of the barrier wall 40 is two, and the two barrier walls 40 are disposed at two ends of the bending area 100, respectively.

Furthermore, in the first embodiment of the present invention, the flexible OLED display panel, according to whether it is bent, is defined into a bending area 100 and two non-bending areas 101 disposed on upper and lower sides of the bending area 100. A middle portion of the bending area 100 falls into the active area 201, and left and right sides of the bending area 100 fall into the non-active area 202. The two barrier walls 40 are disposed in two areas where the left and right sides of the bending area 100 fall into the non-active area 202.

As shown in FIG. 3, in the first embodiment of the present invention, the flexible OLED display panel is bendable at upper and lower sides of the bending area 100, so that the two non-bending areas 101 cooperatively form an angle. The barrier walls 40 at opposite sides of the bending area 100 completely block an intrusion path of water and oxygen, thereby to increase a lifespan of the flexible OLED display panel, and to avoid abnormal display caused by cracks in the bending area.

Specifically, as shown in FIG. 4, the flexible OLED display panel is bendable at two preset bending areas 100. A number of the barrier wall 40 is four, and each of two ends of each bending area 100 is configured with the barrier wall 40.

Furthermore, in the second embodiment of the present invention, the flexible OLED display panel, according to whether it is bent, is defined into two bending areas 100 spaced apart from each other, two non-bending areas 101 disposed at left and right sides of the two bending areas 100, and a non-bending area 101 disposed between the two bending areas 100. Middle portions of the bending areas 100 fall into the active area 201, and upper and lower sides of the bending areas 100 fall into the non-active area 202. The four barrier walls 40 are disposed in four areas where the upper and lower sides of the two bending areas 100 fall into the non-active area 202.

As shown in FIG. 6, in the second embodiment, the flexible OLED display panel is bendable at left and right sides of the bending area 100, so that the flexible OLED display panel bends to form an inverted U shape. The barrier walls 40 at opposite sides of the bending area 100 completely block an intrusion path of water and oxygen, thereby to increase a lifespan of the flexible OLED display panel, and to avoid abnormal display caused by cracks in the bending area.

Specifically, material of the barrier wall 40 is particles capable of absorbing water and oxygen, such as a composite of high molecular polymer and water-absorbing nanoparticles. Preferably, the high molecular polymer is selected from a group consisting of acryl, polyethylene and polycarbonate. The moisture-absorbing nanoparticles each are selected from a group consisting of calcium oxide and calcium chloride.

Specifically, a thickness of the barrier wall 40 in a direction perpendicular to the first inorganic layer 30 is 1-3 micrometers.

Specifically, the display layer 20 includes a thin-film transistor driving circuit layer 21 and an organic light emitting diode (OLED) device layer 22 disposed on the thin-film transistor driving circuit layer 21.

Specifically, the first inorganic layer 30 and the second inorganic layer 60 are made of a group consisting of silicon nitride, silicon oxide, and aluminum oxide.

Specifically, the organic layer is made of hexamethyldisiloxane, polyacrylate, or polystyrene. A thickness of the organic layer 50 is slightly greater than a thickness of the barrier wall 40 to ensure that the organic layer 50 can cover the barrier wall 40.

Specifically, the first inorganic layer 30 and the second inorganic layer 60 are formed by a chemical vapor deposition process. The organic layer 50 is formed by spin coating or an inkjet printing process. The barrier wall 40 is formed by spin coating or an inkjet printing process.

Accordingly, the present invention provides a flexible organic light emitting diode (OLED) display panel including a flexible substrate, a display layer disposed on the flexible substrate, a first inorganic layer disposed on the display layer, a barrier wall disposed on the first inorganic layer and configured to prevent moisture and oxygen intrusion, an organic layer disposed on the barrier wall and the first inorganic layer, and a second inorganic layer disposed on the organic layer. The flexible OLED display panel is bendable at a preset bending area, and the barrier wall is disposed in the preset bending area and located outside an active area of the flexible OLED display panel. By adding the barrier wall in the bending area, the flexible OLED display panel can be improved on performance of blocking water and oxygen in the bending area, thereby extending a lifespan of the flexible OLED display panel and avoiding abnormal display caused by cracks in the bending area. The present invention further provides a method of manufacturing a flexible OLED display panel, capable of improving performance of blocking water and oxygen in the bending area of the flexible OLED display panel, thereby extending a lifespan of the flexible OLED display panel and avoiding abnormal display caused by cracks in the bending area.

It is understood that the invention, to those skilled in the art, may be embodied in other forms according to the technical solutions and technical ideas of the present invention. Thus the present examples and embodiments are to be considered in all respects as illustrative, and not restrictive, of the invention defined by the claims.

What is claimed is:

1. A flexible organic light emitting diode (OLED) display panel, comprising:
   a flexible substrate, a display layer disposed on the flexible substrate, a first inorganic layer disposed on the display layer, a barrier wall disposed on the first inorganic layer and configured to prevent moisture and oxygen intrusion, an organic layer disposed on the barrier wall and the first inorganic layer, and a second inorganic layer disposed on the organic layer;
   wherein the flexible OLED display panel is bendable at a preset bending area, and the barrier wall is disposed in the preset bending area and located outside an active area of the flexible OLED display panel.

2. The flexible OLED display panel of claim 1, wherein the flexible OLED display panel is capable of bending at the preset bending area, a number of the barrier wall is two, and the two barrier walls are disposed at two ends of the bending area, respectively.

3. The flexible OLED display panel of claim 1, wherein the flexible OLED display panel is capable of bending at two preset bending areas spaced apart from each other, a number of the barrier wall is four, and the barrier walls are disposed at two ends of each of the bending areas, respectively.

4. The flexible OLED display panel of claim 1, wherein the barrier wall is made of a composite of high molecular polymer and water-absorbing nanoparticles.

5. The flexible OLED display panel of claim 4, wherein the high molecular polymer is selected from a group consisting of acryl, polyethylene, and polycarbonate, and the moisture-absorbing nanoparticles each are selected from a group consisting of calcium oxide and calcium chloride.

* * * * *